(12) United States Patent
Swanson

(10) Patent No.: US 7,468,485 B1
(45) Date of Patent: Dec. 23, 2008

(54) BACK SIDE CONTACT SOLAR CELL WITH DOPED POLYSILICON REGIONS

(75) Inventor: Richard M. Swanson, Los Altos, CA (US)

(73) Assignee: Sunpower Corporation, San Jose, CA (US)

( * ) Notice: Subject to any disclaimer, the term of this patent is extended or adjusted under 35 U.S.C. 154(b) by 566 days.

(21) Appl. No.: 11/201,817

(22) Filed: Aug. 11, 2005

(51) Int. Cl.
*H01L 25/00* (2006.01)

(52) U.S. Cl. .................................................. 136/243

(58) Field of Classification Search .................. None
See application file for complete search history.

(56) References Cited

U.S. PATENT DOCUMENTS

| | | | |
|---|---|---|---|
| 3,961,997 A * | 6/1976 | Chu | 438/97 |
| 4,927,770 A | 5/1990 | Swanson | |
| 5,030,295 A * | 7/1991 | Swanson et al. | 136/256 |
| 5,053,083 A | 10/1991 | Sinton | |
| 5,057,439 A | 10/1991 | Swanson et al. | |
| 5,164,019 A | 11/1992 | Sinton | |
| 5,360,990 A | 11/1994 | Swanson | |
| 5,369,291 A | 11/1994 | Swanson | |
| 5,641,362 A * | 6/1997 | Meier | 136/256 |
| 6,274,402 B1 | 8/2001 | Verlinden et al. | |
| 6,313,395 B1 | 11/2001 | Crane et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,998,288 B1 * | 2/2006 | Smith et al. | 438/48 |

OTHER PUBLICATIONS

W.P. Mulligan, et al., "A Flat-Plate Concentrator: Micro-Concentrator Design Overview", 2000, 3 sheets, Proceedings of the 28th IEEE PVSC.

Keith R. McIntosh, et al., "The Choice of Silicon Wafer for the Production of Low-Cost Rear-Contact Solar Cells", May 2003, 4 sheets, Sunpower Corporation, Sunnyvale, CA.

P.J. Verlinden, et al., "Will We have a 20%-Efficient (PTC) Photovoltaic System?", 2001, 6 sheets, Proceedings of the 17th Europe Photovoltaic Solar Engery Conference.

William P. Mulligan, et al., "Development of Chip-Size Silicon Solar Cells", 2000, 6 sheets, Proceedings of the 28th IEEE PVSC.

Akira Terao, et al., "A Mirror-Less Design for Micro-Concentrator Modules", 2000, 4 sheets, Proceedings of the 28th IEEE PVSC.

(Continued)

*Primary Examiner*—Alexa D. Neckel
*Assistant Examiner*—Mariam Berdichevsky
(74) *Attorney, Agent, or Firm*—Okamoto & Benedicto LLP

(57) ABSTRACT

In one embodiment, a back side contact solar cell includes a tunnel oxide layer formed on a back side of a substrate. A polysilicon layer is formed on the tunnel oxide layer, and dopant sources are formed on the polysilicon layer. Dopants from the dopant sources are diffused into the polysilicon layer to form p-type and n-type regions therein. The p-type and n-type regions form p-n junctions that, among other advantages, allow for relatively high conversion efficiency.

20 Claims, 8 Drawing Sheets

OTHER PUBLICATIONS

P.J. Verlinden, et al., "Backside-Contact Silicon Solar Cells with Improved Efficiency for the '96 World Solar Challenge", 1997, 5 sheets, Proceedings of the 15th EPSEC.

P.J. Verlinden, et al., "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson "The Promise of Concentrators", 2000, Prog. Photovolt. Res. Appl. 8, pp. 93-111.

Ronald A. Sinton, et al., "Simplified Backside-Contact Solar Cells", Feb. 1990, pp. 348-352, IEEE Transactions on Electron Devices, vol. 37, No. 2.

Ronald A. Sinton "Device Physics and Characterization of Silicon Point-Contact Solar Cells", Feb. 1997, pp. 1-154, Stanford Electronics Laboratories, Stanford University, CA.

Richard Roland King "Studies of Oxide-Passivated Emitters in Silicon and Applications to Solar Cells", Aug. 1990, pp. 1-200, (Thesis) Electrical Engineering Department of Stanford University, CA.

* cited by examiner

BACK SIDE CONTACT SOLAR CELL WITH DOPED POLYSILICON REGIONS

BACKGROUND OF THE INVENTION

1. Field of the Invention

The present invention relates generally to solar cells, and more particularly but not exclusively to back side contact solar cell structures and fabrication processes.

2. Description of the Background Art

Solar cells are well known devices for converting solar radiation to electrical energy. They may be fabricated on a semiconductor wafer using semiconductor processing technology. Generally speaking, a solar cell may be fabricated by forming p-type regions and n-type regions in a silicon substrate. Each adjacent p-type region and n-type region forms a p-n junction. Solar radiation impinging on the solar cell creates electrons and holes that migrate to the p-type and n-type regions, thereby creating voltage differentials across the p-n junctions. In a back side contact solar cell, the p-type and n-type regions are coupled to metal contacts on the back side of the solar cell to allow an external electrical circuit or device to be coupled to and be powered by the solar cell. Back side contact solar cells are also disclosed in U.S. Pat. Nos. 5,053,083 and 4,927,770, which are both incorporated herein by reference in their entirety.

The conversion efficiency of a solar cell is a measure of how much electrical power the solar cell generates relative to received solar radiation. Although currently available solar cells are very efficient, even more efficient solar cells are required to meet future demands for renewable energy sources.

SUMMARY

In one embodiment, a back side contact solar cell includes a tunnel oxide layer formed on a back side of a substrate. A polysilicon layer is formed on the tunnel oxide layer, and dopant sources are formed on the polysilicon layer. Dopants from the dopant sources are diffused into the polysilicon layer to form p-type and n-type regions therein. The p-type and n-type regions form p-n junctions that, among other advantages, allow for relatively high conversion efficiency.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present disclosure relates to the fabrication of solar cells. Solar cell fabrication processes are also disclosed in the following commonly-assigned disclosures, which are all incorporated herein by reference in their entirety: U.S. application Ser. No. 10/412,638, entitled "Improved Solar Cell and Method of Manufacture," filed on Apr. 10, 2003 by William P. Mulligan, Michael J. Cudzinovic, Thomas Pass, David Smith, Neil Kaminar, Keith McIntosh, and Richard M. Swanson; U.S. application Ser. No. 10/412,711, entitled "Metal Contact Structure For Solar Cell And Method Of Manufacture," filed on Apr. 10, 2003 by William P. Mulligan, Michael J. Cudzinovic, Thomas Pass, David Smith, and Richard M. Swanson; and U.S. application Ser. No. 10/946,564, entitled "Use of Doped Silicon Dioxide In The Fabrication Of Solar Cells," filed on Sep. 21, 2004 by David D. Smith, Michael J. Cudzinovic, Keith R. McIntosh, and Bharatkumar G. Mehta.

Figure 1:
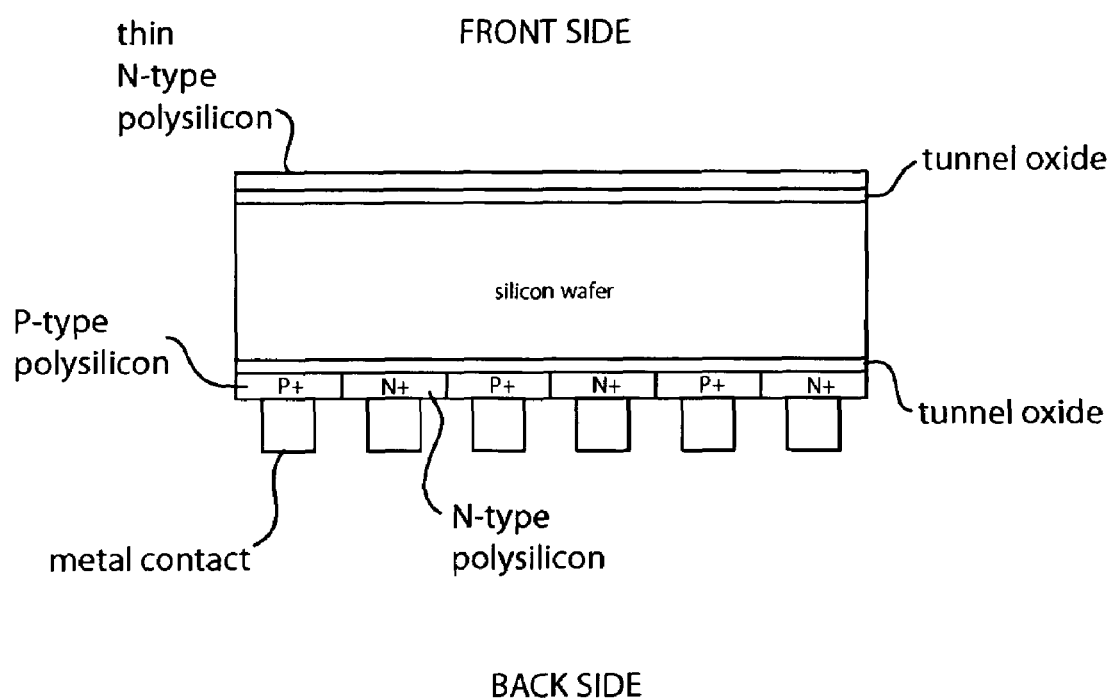
FIG. 1 shows a simplified schematic diagram of a back side contact solar cell in accordance with an embodiment of the present invention.

FIG. 1 shows a simplified schematic diagram of a back side contact solar cell in accordance with an embodiment of the present invention. The solar cell of FIG. 1 employs a silicon wafer having a front side portion configured to face the sun to receive solar radiation during normal operation and a back side portion where metal contacts to the solar cell are formed. In contrast to currently available solar cells, the solar cell of FIG. 1 includes p-type and n-type regions formed not in the silicon wafer itself, but in a polysilicon layer on the back side of the wafer. The back side polysilicon layer may be doped to have the p-type and n-type regions, with each adjacent p-type region and n-type region forming a p-n junction of the solar cell. The back side (and front side) polysilicon layer may be doped a variety of ways without detracting from the merits of the present invention. Preferably, as will be more apparent below, dopant sources (not shown in FIG. 1) are formed on the back side polysilicon layer. Dopants from the dopant sources may be diffused into the back side polysilicon layer to form the p-type and n-type regions therein. A tunnel oxide layer may be formed on the back side of the wafer directly between the wafer and the back side polysilicon layer. The tunnel oxide is sufficiently thin (e.g. about 7 to 20 Angstroms, preferably about 10 Angstroms) to allow for increased probability of electrons directly tunneling across it. The back side tunnel oxide layer blocks the back side flow of minority carriers (i.e. holes into the n-type regions and electrons into the p-type regions). The thickness of the back side tunnel oxide should be adjusted such that the flow of majority carriers is not adversely blocked. Metal contacts are connected to the p-type and n-type regions to allow external circuits and devices to receive electrical power from the solar cell.

The solar cell of FIG. 1 may optionally include a tunnel oxide layer and a relatively thin (e.g. 200 Angstroms) n-type polysilicon layer on the front side of the wafer. The front side tunnel oxide layer and n-type polysilicon layer reduce the recombination of electrons and holes at the front surface and are more effective than the tunnel oxide layer alone due to the band bending potential caused by the n-type doped polysilicon.

The solar cell of FIG. 1 has numerous advantages over solar cells that have in-wafer p-type and n-type regions. Modeling results indicate that the solar cell of FIG. 1 may have an efficiency approaching 26%. The diffusion of dopants into the polysilicon layer instead of the wafer may be performed by rapid thermal annealing (RTP) or other annealing process, which may cut down diffusion processing steps. The polysilicon layers on the front side and backside of the wafer cap the wafer surfaces, preventing contamination and making the solar cell more stable. Because the metal contacts are connected to the back side polysilicon layer instead of directly to the wafer itself, the metal contact opening to the p-type and n-type regions may be made larger compared to those in conventional solar cells. Furthermore, contacted and non-contacted regions can have low recombination, which is called a passivated contact.

Figure 7:
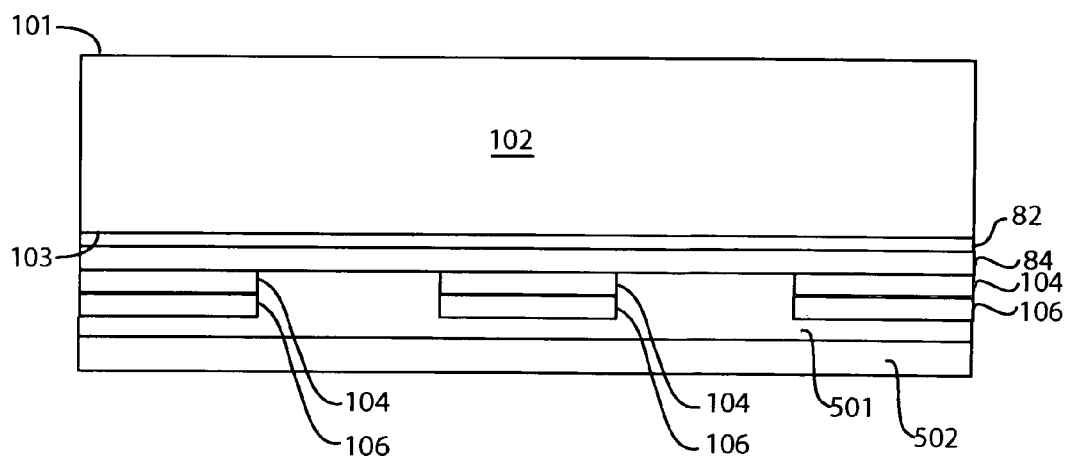
Figure 8:
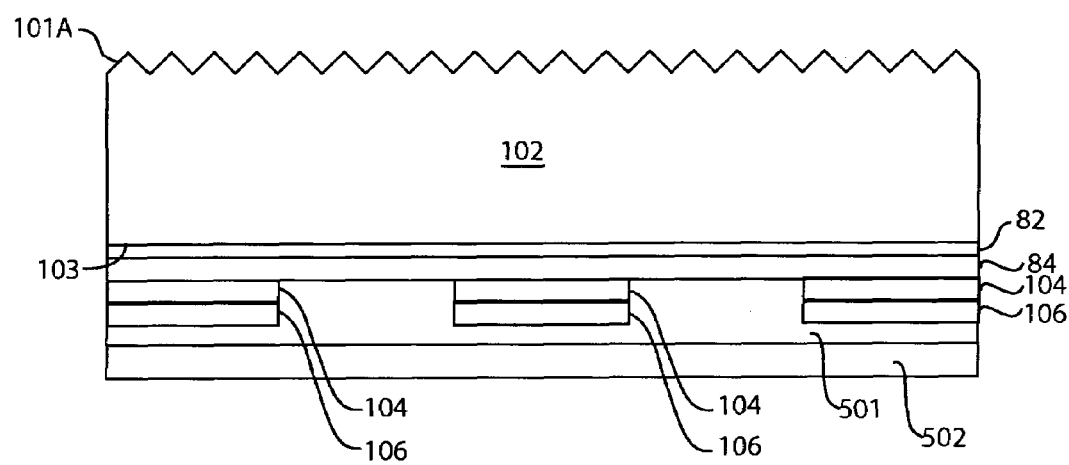
Figure 9:
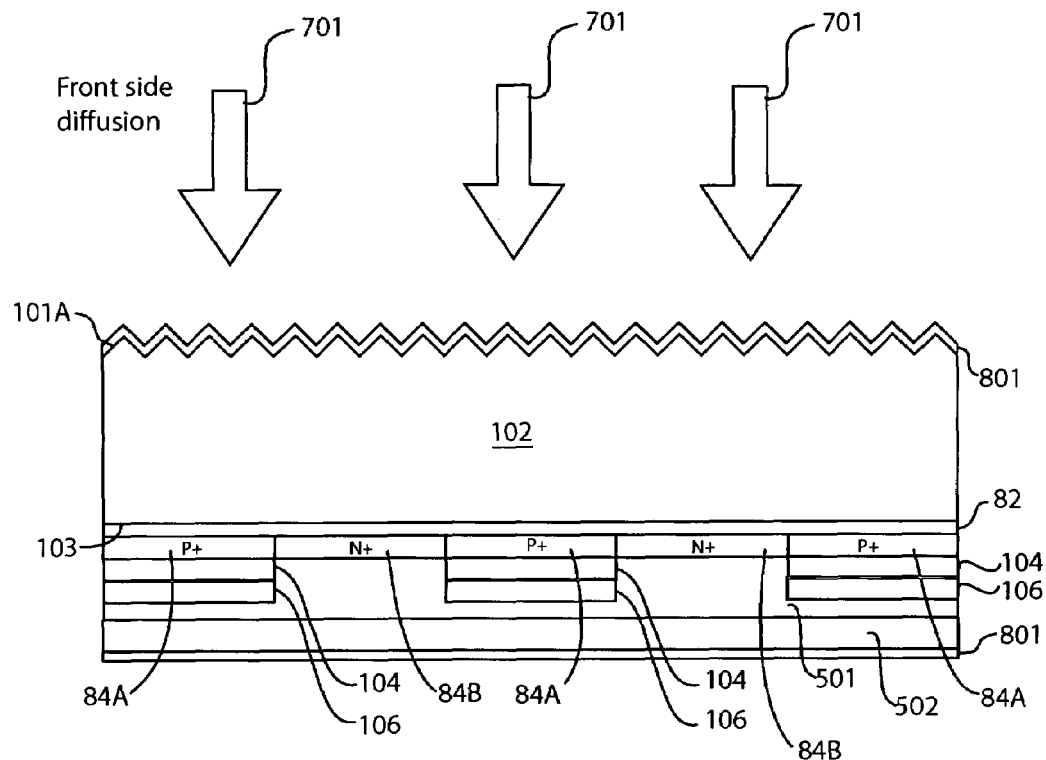
Figure 10:
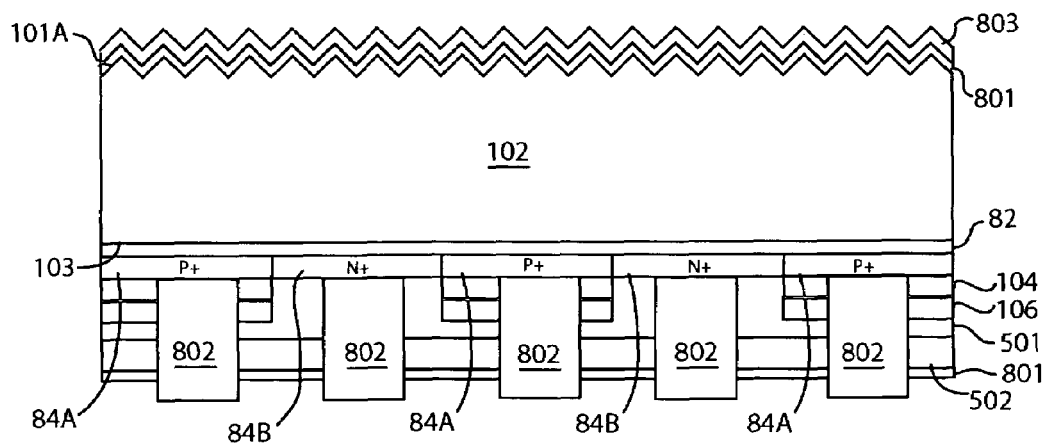
Figure 11:
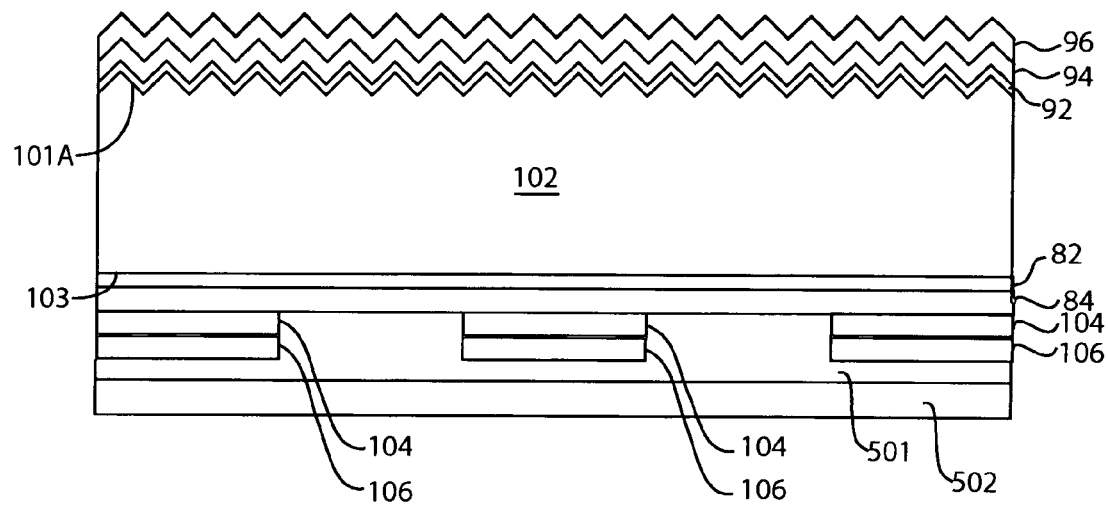
Figure 12:
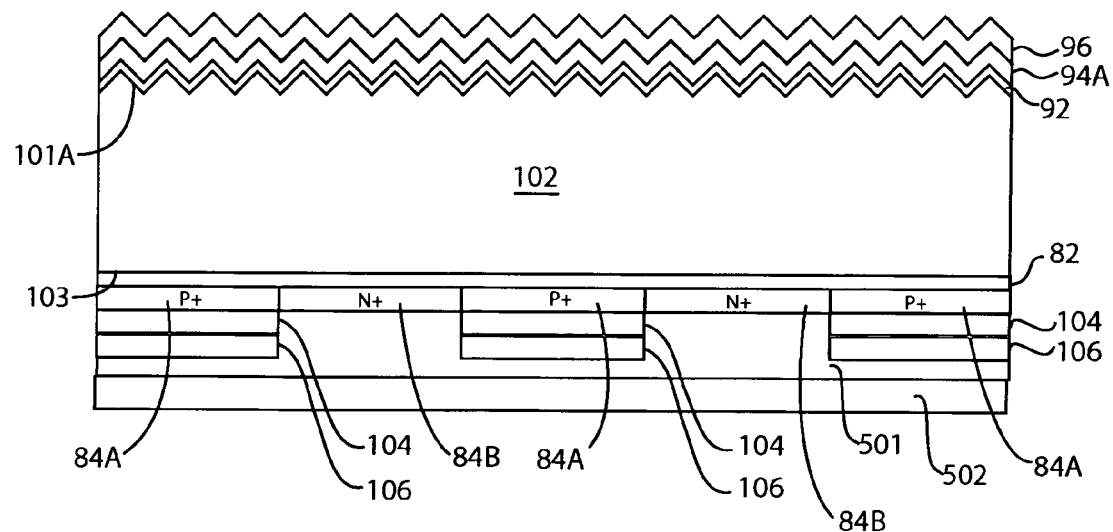
Figure 13:
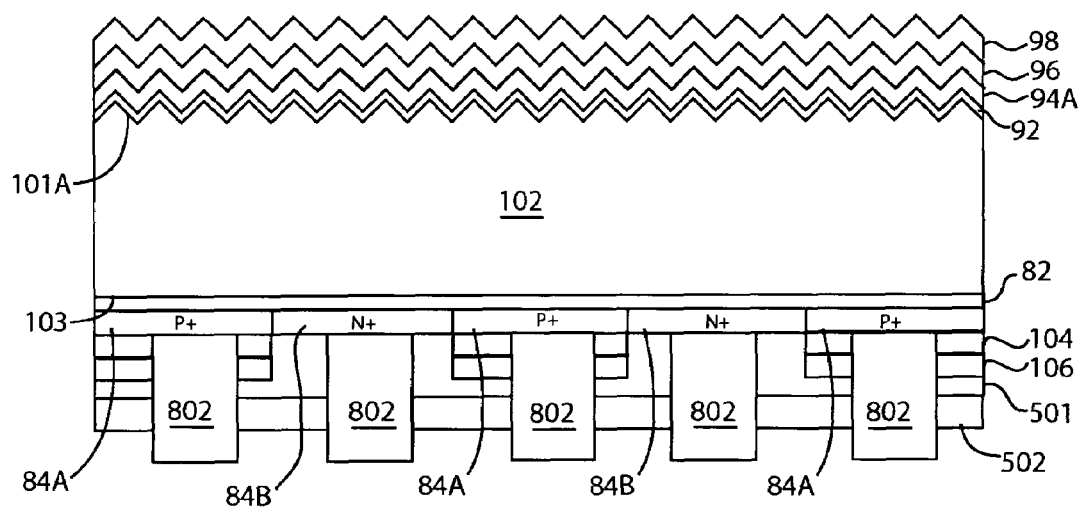

FIGS. 2-13 schematically illustrate the fabrication of a back side contact solar cell in accordance with embodiments of the present invention. FIGS. 2-8 schematically illustrate the fabrication of the solar cell up to the step where the front side of the substrate is textured. FIGS. 9 and 10 schematically illustrate fabrication steps after the front side of the substrate is textured in a preferred embodiment where a tunnel oxide layer and a doped polysilicon layer are not formed on the front side. FIGS. 11-13 schematically illustrate fabrication steps after the front side of the substrate is textured in an optional embodiment where a tunnel oxide layer and a doped polysilicon layer are formed on the front side.

Figure 2:
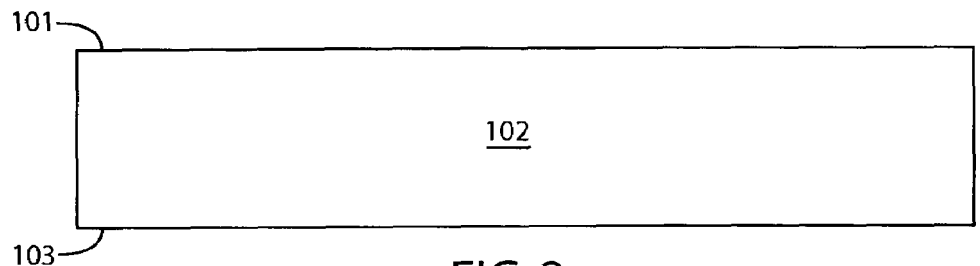
FIGS. 2-13 schematically illustrate the fabrication of a back side contact solar cell in accordance with embodiments of the present invention.

Starting in FIG. 2, an n-type FZ or n-type CZ silicon wafer 102 is processed to a thickness of about 280 μm. Wafer 102 serves as the substrate of the back side contact solar cell being fabricated. Wafer 102 has a front side 101 and a back side 103. Front side 101 is the side of the solar cell configured to receive solar radiation and thus faces the sun during normal operation. Wafer 102 is thinned to a thickness of about 240 μm using a process that also etches damages from the surfaces of the wafer. The aforementioned process is also referred to as "bath damage etch/critical clean" and, in one embodiment, comprises a wet etch using potassium hydroxide (e.g., two parts potassium hydroxide to water).

Figure 3:
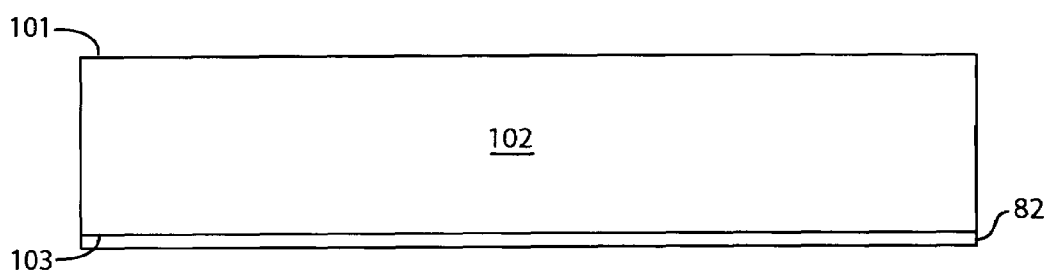

In FIG. 3, a tunnel oxide layer 82 is formed on the back side 103 of the wafer 102. Tunnel oxide layer 82 is formed such that it is sufficiently thin to increase the probability of electrons directly tunneling across tunnel oxide layer 82. Tunnel oxide layer 82 may be formed to a thickness of about 7 to 20 Angstroms. In one embodiment, tunnel oxide layer 82 is about 10 Angstroms. Tunnel oxide layer 82 may be formed using an ozone oxidation process, which involves dipping wafer 102 in a bath comprising ozone suspended in deionized water. Preferably, the ozone oxidation process is performed in-situ (i.e. in the same equipment in one loading) with the step of thinning wafer 102 in FIG. 1. For example, wafer 102 may first undergo a wet etch using potassium hydroxide to thin wafer 102, then a rinse-clean cycle, then the ozone oxidation process to form tunnel oxide layer 82 all in the same equipment. During the ozone oxidation process, a layer of tunnel oxide grows on both sides of wafer 102. The layer of tunnel oxide grown on the front side of wafer 102 is not shown in FIG. 3 as that layer is irrelevant to the invention and is ultimately removed during a subsequent etching step later described with reference to FIG. 6. It is to be noted that tunnel oxide layer 82 may also be formed using other processes without detracting from the merits of the present invention.

Figure 4:
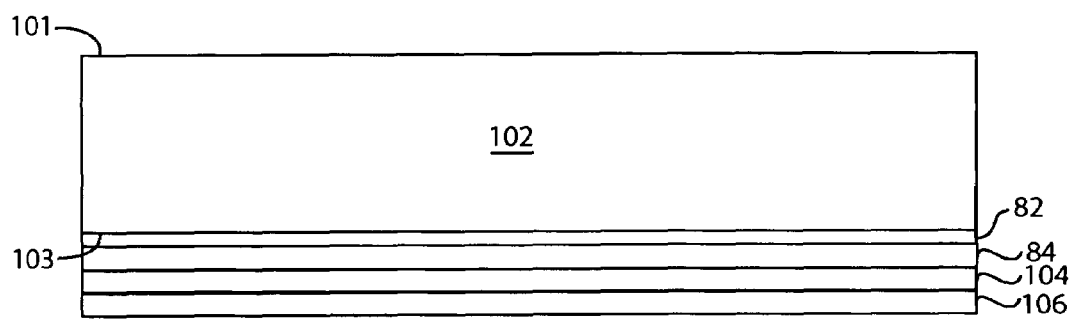

In FIG. 4, a stack of materials comprising a polysilicon layer 84, a p-type dopant source 104, and an undoped silicon dioxide layer 106 is formed over tunnel oxide layer 82. Polysilicon layer 84 may have a thickness of about 2000 Angstroms, for example. Polysilicon layer 84 may be deposited on tunnel oxide 82 by atmospheric pressure chemical vapor deposition (APCVD). As will be more apparent below, p-type and n-type regions of the solar cell being fabricated may be advantageously formed in polysilicon layer 84 using suitable doping steps.

Still referring to FIG. 4, p-type dopant source 104 is formed over polysilicon layer 84. P-type dopant source 104 may comprise a layer of boron-doped silicon dioxide ($SiO_2$), also referred to as "BSG". Note that depending on the application, p-type dopant source 104 may also comprise p-type dopants other than boron. P-type dopant source 104 may be deposited to a thickness of about 1000 Angstroms by APCVD. As its name implies, p-type dopant source 104 provides p-type dopants in a subsequently performed diffusion step to form p-type regions in polysilicon layer 84. It is to be noted that the thickness of p-type dopant source 104, and other materials disclosed herein, may be varied depending on the application. For example, p-type dopant source 104 may also be deposited to a thickness of about 500 Angstroms by APCVD.

Undoped silicon dioxide layer 106 is deposited over p-type dopant 104. Undoped silicon dioxide layer 106 may be deposited to a thickness of about 1200 Angstroms also by APCVD. Undoped silicon dioxide layer 106 advantageously prevents dopants from p-type dopant source 104 from diffusing to layers other than polysilicon layer 84 in the subsequently performed diffusion step.

Preferably, polysilicon layer 84, p-type dopant source 104, and undoped silicon dioxide layer 106 are formed in-situ in one loading of wafer 102 in the same APCVD equipment. The use of a deposition process, such as APCVD, to deposit oxides on a solar cell advantageously allows for one-sided deposition. This is particularly useful in the manufacture of back side contact solar cells where only one side of the solar cell is textured.

Figure 5:
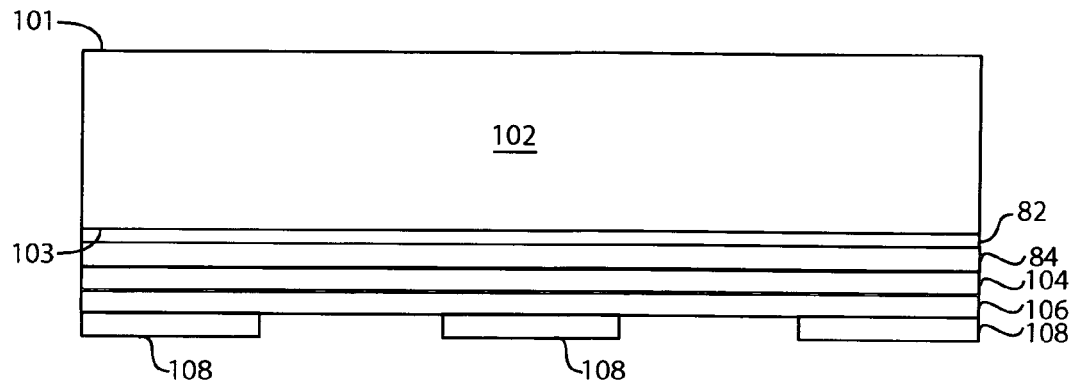

In FIG. 5, a mask 108 is formed over undoped silicon dioxide layer 106. Mask 108 will be used in a subsequent etch process (see FIG. 6) exposing portions of polysilicon layer 84 where n-type regions will be formed. Mask 108 may comprise an ink formed by a printing process such as screen printing, pad printing, or ink-jet printing. In one embodiment, the ink comprises a particle-free ink, and may be of the same type as the Coates ER-3070 ink available from Coates Screen of St. Charles, Ill. The particle-free ink may be applied by screen printing. The use of a printing process, such as screen printing, is advantageous in that sufficiently small feature sizes can be achieved with lower process costs.

Figure 6:
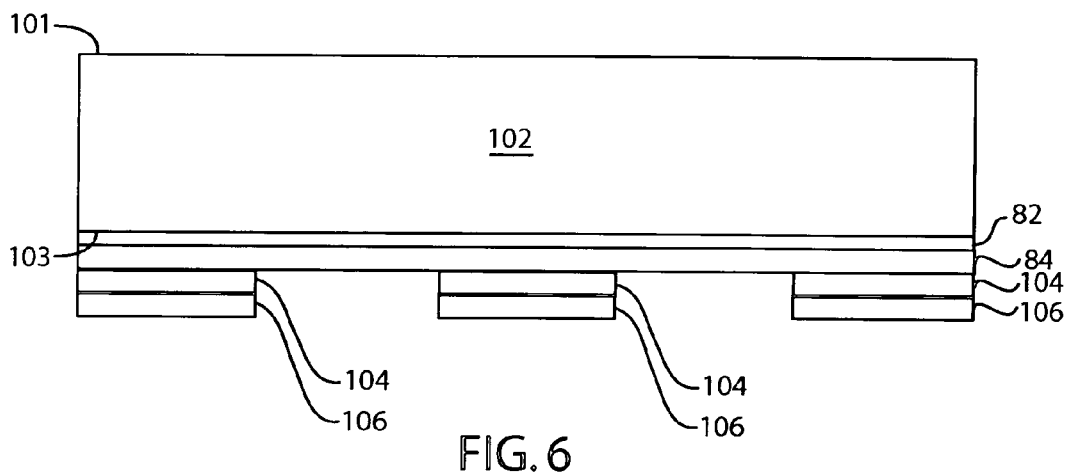

In FIG. 6, mask 108 is employed in etching undoped silicon dioxide layer 106 and p-type dopant source 104 to expose portions of polysilicon layer 84 where n-type regions will be formed. In one embodiment, the silicon dioxide stack formed by silicon dioxide layer 106 and p-type dopant source 104 is patterned using a wet etch process comprising buffered hydrofluoric acid. The wet etch process uses polysilicon layer 84 as an etch stop, and etches portions of the silicon dioxide stack not covered by mask 108. Mask 108 is thereafter removed. As mentioned, any tunnel oxide grown on front side 101 of wafer 102 during the step of forming tunnel oxide 82 is removed by the wet etch process.

In FIG. 7, an n-type dopant source 501 is formed over the sample of FIG. 6. As its name implies, n-type dopant source 501 provides n-type dopants in the subsequently performed diffusion step to form n-type regions in polysilicon layer 84. In one embodiment, n-type dopant source 501 comprises a layer of phosphorus-doped silicon dioxide. Depending on the application, n-type dopant source 501 may also comprise n-type dopants other than phosphorus. N-type dopant source 501 may be deposited to a thickness of about 500 Angstroms by APCVD, for example. As shown in FIG. 7, an undoped silicon dioxide layer 502 is deposited over n-type dopant source 501. Undoped silicon dioxide layer 502 may be deposited to a thickness of about 2400 Angstroms also by APCVD.

N-type dopant source 501 and undoped silicon dioxide layer 502 are preferably deposited to be conformal to their respective underlying layers.

In FIG. 8, front side 101 of wafer 102 is textured. Front side 101 may be textured using a wet etch process comprising potassium hydroxide and isopropyl alcohol, for example. The wet etch process textures front side 101 with random pyramids, thereby advantageously improving solar radiation collection efficiency. Undoped silicon dioxide layer 502 advantageously protects the materials on the back side of wafer 102 from the texturing solution. In FIG. 8, front side 101 has been relabeled as "101A" to indicate that it has been textured.

In FIG. 9, the sample of FIG. 8 is subjected to in-situ steps. The steps are in-situ in that they are performed in one loading of wafer 102 into the wafer processing tool. In one embodiment, the in-situ steps are performed in a furnace. In the first in-situ step, wafer 102 is heated to diffuse dopants from p-type dopant source 104 and n-type dopant source 501 into polysilicon layer 84. This results in the doping of polysilicon layer 84 to form p-type and n-type regions therein. In the example of FIG. 9, directly adjacent p-type and n-type regions form a p-n junction in a continuous portion of the polysilicon layer 84. Regions of polysilicon layer 84 that have been doped by p-type dopants from p-type dopant source 104 are referred to and labeled as "p-type regions 84A." Similarly, regions of polysilicon layer 84 that have been doped by n-type dopants from n-type dopant source 501 are referred to and labeled as "n-type regions 84B." Note that during the first in-situ step, undoped silicon dioxide layer 106 advantageously prevents n-type dopants (phosphorus in this example) from n-type dopant 501 from diffusing into p-type dopant source 104. Also, undoped silicon dioxide layer 502 advantageously prevents dopants from n-type dopant source 501 from diffusing into the furnace. The heating of wafer 102 to diffuse dopants into polysilicon layer 84 may be performed using a conventional annealing process, including rapid thermal annealing (RTP).

In the second in-situ step, the furnace conditions are changed to an atmosphere containing phosphorus oxychloride, then to an atmosphere containing oxygen to diffuse phosphorus as an n-type dopant into wafer 102 from its front side, and to grow a thin layer of silicon dioxide 801 on both sides of wafer 102. The thin layer of silicon dioxide 801 advantageously leads to better passivation of the front side and back side surfaces of wafer 102. In FIG. 9, the front side diffusion of n-type dopants into wafer 102 is schematically represented by arrows 701. As can be appreciated the use of in-situ steps to drive dopants into wafer 102 simplifies the fabrication process.

In FIG. 10, a back-end process is employed to form metals 802 connected to the p-type regions 84A and n-type regions 84B and to include an anti-reflective coating 803 (e.g., silicon nitride) on top of the silicon dioxide 801 on the front side of wafer 102. For example, a back-end process similar to that disclosed in U.S. application Ser. No. 10/412,638 may be employed. Conventional solar cell back-end processes may also be employed without detracting from the merits of the present invention. Because metals 802 are connected to p-type regions 84A and n-type regions 84B, which are in a polysilicon layer rather than the wafer itself, the apertures through which metals 802 contact the aforementioned polysilicon regions may be made relatively large compared to conventional solar cells.

As mentioned, tunnel oxide and doped polysilicon may also be formed on the front side of the solar cell depending on the application. The optional steps of forming a tunnel oxide layer and a doped polysilicon layer on the front side of the solar cell are now discussed with reference to FIGS. 11-13.

The process step illustrated with FIG. 11 follows that of FIG. 8. In FIG. 11, a tunnel oxide layer 92 is formed over front side 101A in the sample of FIG. 8. Tunnel oxide layer 92 may be formed to a thickness of about 10 Angstroms using an ozone oxide process, for example. A polysilicon layer 94 is then formed over tunnel oxide layer 92. Polysilicon layer 94 may be formed to a thickness of about 200 Angstroms by APCVD, for example. An n-type dopant source 96 is then formed over polysilicon layer 94. As will be more apparent below, n-type dopant source 96 provides n-type dopants for doping polysilicon layer 94. In one embodiment, n-type dopant source 96 comprises phosphorus doped silicon dioxide formed to a thickness of about 200 Angstroms by APCVD.

In FIG. 12, wafer 102 is heated to diffuse dopants from p-type dopant source 104 and n-type dopant source 501 into polysilicon layer 84 and to diffuse dopants from n-type dopant source 96 into polysilicon layer 94. This results in the doping of polysilicon layers 84 and 94. Regions of polysilicon layer 84 that have been doped by p-type dopants from p-type dopant source 104 are referred to and labeled as "p-type regions 84A." Similarly, regions of polysilicon layer 84 that have been doped by n-type dopants from n-type dopant source 501 are referred to and labeled as "n-type regions 84B." In the example of FIG. 12, directly adjacent p-type and n-type regions form a p-n junction in a continuous portion of the polysilicon layer 84. Undoped silicon dioxide layer 106 and undoped silicon dioxide layer 502 advantageously contain the diffusion of dopants as before. Polysilicon layer 94 on the front side of the solar cell have been relabeled as "94A" to indicate that it has been doped to become an n-type doped polysilicon layer. The heating of wafer 102 to diffuse dopants into polysilicon layers 84 and 94 may be performed using a conventional annealing process, including rapid thermal annealing (RTP).

In FIG. 13, a back-end process is employed to form metals 802 connected to p-type regions 84A and n-type regions 84B and to include an anti-reflective coating 98 (e.g., silicon nitride) on top of n-type dopant source 96 on the front side of the solar cell. For example, a back-end process similar to that disclosed in U.S. application Ser. No. 10/412,638 may be employed. Conventional solar cell back-end processes may also be employed without detracting from the merits of the present invention.

Figure 14:
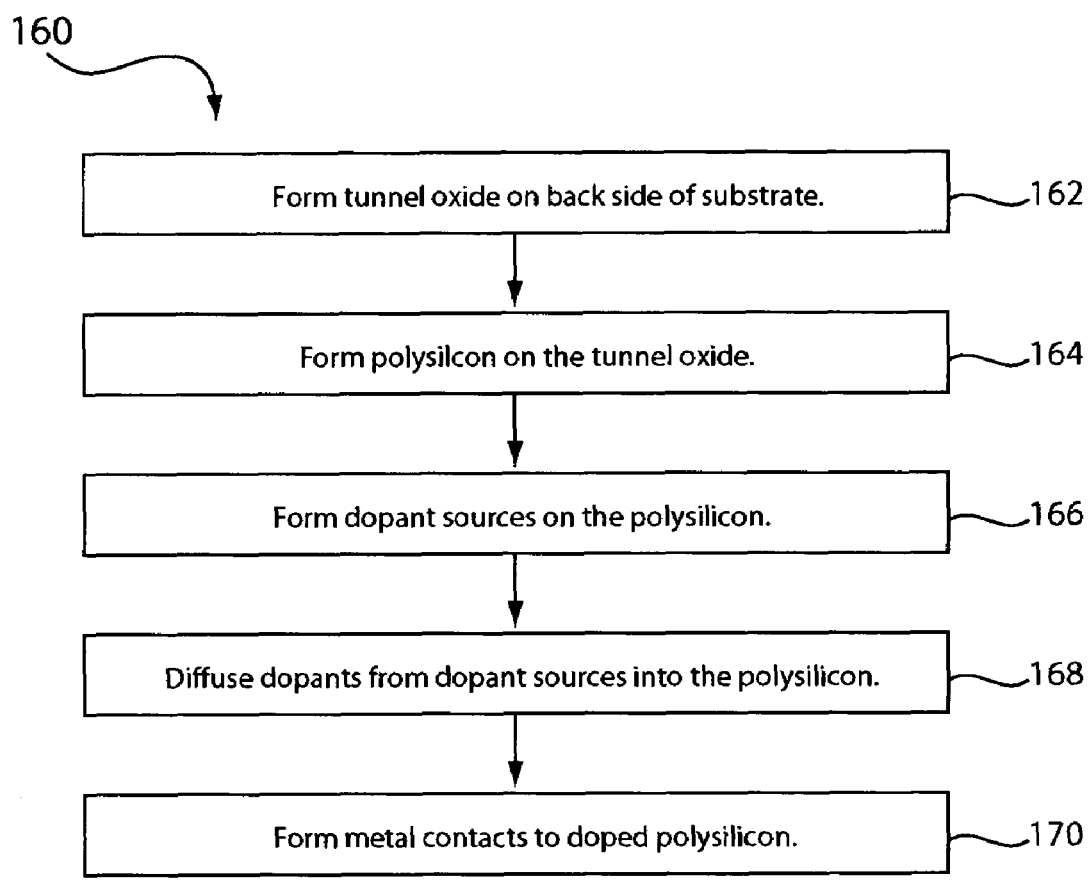
FIG. 14 shows a flow diagram of a method of fabricating a back side contact solar cell in accordance with an embodiment of the present invention.

Referring now to FIG. 14, there is shown a flow diagram of a method 160 of fabricating a solar cell in accordance with an embodiment of the present invention. In step 162, a tunnel oxide layer is formed on a back side of a substrate (e.g. silicon wafer). In step 164, a polysilicon layer is formed on the tunnel oxide layer. In step 166, dopant sources are formed on the polysilicon layer. The dopant sources comprise p-type dopant sources and n-type dopant sources. In one embodiment, the p-type dopant sources comprise boron and the n-type dopant sources comprise phosphorus. In step 168, the polysilicon layer is doped by diffusing dopants from the dopant sources into the polysilicon layer. The doping of the polysilicon layer forms n-type and p-type regions therein. Adjacent p-type and n-type regions in the polysilicon layer form a p-n junction of the solar cell. In step 170, metal contacts are connected to the n-type and p-type regions in the polysilicon layer to allow an external circuit or device to be coupled to the solar cell.

An improved back side contact solar cell has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a back side contact solar cell, the method comprising:
   forming a first tunnel oxide layer over a back side of a solar cell substrate;
   forming a first polysilicon layer over the first tunnel oxide layer;
   forming a p-type dopant source and an n-type dopant source over the first polysilicon layer; and
   doping the first polysilicon layer by diffusing dopants from the p-type dopant source and the n-type dopant source into the first polysilicon layer to form a p-type region and an n-type region in a continuous portion of the first polysilicon layer, the p-type region and the n-type region in the first polysilicon layer forming a p-n junction of the solar cell.

2. The method of claim 1 wherein the first tunnel oxide layer is formed to a thickness of about 10 Angstroms.

3. The method of claim 1 wherein the p-type dopant source comprises a boron-doped silicon dioxide.

4. The method of claim 1 wherein the n-type dopant source comprises a phosphorus-doped silicon dioxide.

5. The method of claim 1 further comprising:
   forming a second tunnel oxide layer over a front side of the solar cell substrate;
   forming a second polysilicon layer over the second tunnel oxide layer;
   forming a second n-type dopant source over the second polysilicon layer; and
   doping the second polysilicon layer by diffusing dopants from the second n-type dopant source into the second polysilicon layer.

6. The method of claim 1 further comprising:
   texturing a front side of the solar cell substrate.

7. The method of claim 6 further comprising:
   diffusing n-type dopants into the solar cell substrate by way of the front side of the solar cell substrate.

8. The method of claim 1 wherein a first undoped silicon dioxide layer is formed between the p-type dopant source and the n-type dopant source prior to doping the first polysilicon layer.

9. The method of claim 8 wherein a second undoped silicon dioxide layer is formed over the n-type dopant source prior to doping the first polysilicon layer to prevent dopants from the n-type dopant source from escaping into a furnace environment during the doping of the first polysilicon layer.

10. A back side contact solar cell comprising:
    a substrate having a front side and a back side, the front side of the substrate being configured to face the sun to receive solar radiation during normal operation;
    a first tunnel oxide layer formed over the back side of the substrate;
    a first doped polysilicon layer formed over the first tunnel oxide layer, the first doped polysilicon layer having a plurality of p-type and n-type regions in a continuous portion, each adjacent p-type region and n-type region in the plurality of p-type and n-type regions forming a p-n junction of the solar cell; and
    metal contacts coupled to the p-type and n-type regions, the metal contacts being configured to allow an external device to be coupled to the solar cell.

11. The back side contact solar cell of claim 10 further comprising:
    an anti-reflective coating formed over a textured surface on the front side of the substrate.

12. The back side contact solar cell of claim 10 further comprising:
    a p-type dopant source formed over the first doped polysilicon layer; and
    an n-type dopant source formed over the p-type dopant source and the first doped polysilicon layer.

13. The back side contact solar cell of claim 12 further comprising:
    an undoped silicon dioxide layer formed between the p-type dopant source and the n-type dopant source.

14. The back side contact solar cell of claim 10 wherein the p-type dopant source comprises boron-doped silicon dioxide.

15. The back side contact solar cell of claim 10 wherein the n-type dopant source comprises phosphorus-doped silicon dioxide.

16. The back side contact solar cell of claim 10 further comprising:
    a second tunnel oxide layer formed over a textured surface on the front side of the substrate; and
    a second doped polysilicon layer formed over the second tunnel oxide layer.

17. The back side contact solar cell of claim 16 wherein the second doped polysilicon layer is doped with an n-type dopant.

18. The back side contact solar cell of claim 16 further comprising an n-type dopant source formed over the second doped polysilicon layer.

19. A back side contact solar cell comprising:
    a silicon wafer;
    a tunnel oxide layer formed on a back side of the wafer; and
    a doped polysilicon layer formed on the tunnel oxide layer, the doped polysilicon layer having a continuous portion having boron-doped regions and phosphorus-doped regions, each adjacent boron-doped region and phosphorus-doped region forming a p-n junction of the solar cell.

20. The back side contact solar cell of claim 19 further comprising:
    metal contacts formed to connect to the boron-doped and phosphorus-doped regions for allowing the solar cell to be coupled to an external circuit.

* * * * *